United States Patent [19]

Yazaki

[11] Patent Number: 4,577,959
[45] Date of Patent: Mar. 25, 1986

[54] EXPOSURE APPARATUS

[75] Inventor: Yoshio Yazaki, Chofu, Japan

[73] Assignee: ORC Manufacturing Co., Ltd., Tokyo, Japan

[21] Appl. No.: 615,032

[22] Filed: May 29, 1984

[30] Foreign Application Priority Data

Feb. 10, 1984 [JP] Japan .................................. 59-24093

[51] Int. Cl.$^4$ ............................................. G03B 27/54
[52] U.S. Cl. ........................................ 355/67; 355/53
[58] Field of Search ................... 355/1, 18, 67, 71, 77, 355/55, 78, 53, 56, 57, 58, 59; 350/167, 120, 6.2, 237

[56] References Cited

U.S. PATENT DOCUMENTS 3,217,594 11/1965 Simmon .................................. 355/1
4,497,015 1/1985 Konno et al. ......................... 355/67

OTHER PUBLICATIONS

Mimura et al, "Deep-UV Photolithography", Japanese Journal of Applied Physics, vol. 17, No. 3, pp. 541-550 (Mar., 1978).

Primary Examiner—L. T. Hix
Assistant Examiner—Brian W. Brown
Attorney, Agent, or Firm—Cushman, Darby & Cushman

[57] ABSTRACT

An exposure apparatus comprises a fly eye lens through which the light beam from a light source condensed by a first optical system is supplied to a second optical system which collimates the light to direct it to a work through a mask pattern so that the pattern is printed on the work, the fly eye lens being rotated to uniform the distribution of illuminance so that a clear printed pattern is formed on the work without interference fringes.

9 Claims, 11 Drawing Figures

EXPOSURE APPARATUS

BACKGROUND OF THE INVENTION

The present invention relates to an exposure apparatus, and more particularly to an exposure apparatus for printing a mask pattern on a work applied with a photoresist.

Generally, in such an exposure apparatus, there are a contact type exposure apparatus with the mask for a pattern being disposed to come in contact with the work, a close type exposure apparatus with the mask being spaced in proximity to the work, and a projection type exposure apparatus in which an image of the mask pattern is projected on the work. The present invention concerns the close type exposure apparatus, and is to provide the apparatus having a proximity gap between the work and the mask and suitable for production of the work having a large exposure surface and requiring the pattern accuracy of 5-10 $\mu$m.

FIG. 1 schematically shows a construction of a prior art close type exposure apparatus. A mask 2 is disposed above a surface of a work 1 applied with a photoresist with a predetermined distance D therebetween. The pattern of the mask 2 is projected on the work 1 by a light beam 3 for exposure to be printed on the work 1. Numeral 4 denotes a light source of a far ultraviolet arc lamp including mercury vapor therein (hereinafter called as mercury lamp). The light emitted from the light source is reflected by a pair of oval concave mirrors 5 to be condensed on a first cold mirror 6. The light beam 3 for exposure reaches the mirror 6 and only the ultraviolet rays necessary for exposure are reflected by the mirror 6. The reflected rays pass through a fly eye lens 7 to be reflected by a second cold mirror 6' and are collimated by a lens 8. The collimated light beam 3 is directed on the mask 2. The fly-eye lens 7 functions to uniform the brightness of the light beam 3 over the whole area of the exposure surface. A proximity gap D is disposed between the work 1 and the mask 2 so that the mask 2 does not bring in contact with the surface of the work 1 applied with the photoresist. The light source 4 uses a xenon mercury lamp of which emitted light contains bright line spectra of 365 nm, 400 nm and 435 nm. The bright lines are partially arranged in phase. It is recognized that the bright lines contain coherent light by 1-5% in all the emitted rays of light.

FIG. 2 shows the enlarged work 1 and mask 2. The mask 2 is formed with a slit or cut 9 forming a pattern. Assuming that the width of the cut 9 is l, the light beam 3 is diffracted at an edge of the mask to produce Fresnel diffraction fringes on the photoresisted surface of the work 1. Accordingly, when the geometric distance X from the position just under the edge changes, the bright line of 365 nm, for example, produces fringes with regard to the distance X. Assuming that the wavelength of the light beam 3 is $\lambda$, the proximity gap D, and the distance from just under the edge X, the condition in which the fringes are produced is as follows:

When $\sqrt{D^2+X^2}-D=m\lambda$, bright fringes are produced at $X \doteq \sqrt{2mD\lambda}$.

When $\sqrt{D^2+X^2}-D=\lambda/2(2m+1)$, dark fringes are produced at $X \doteq \sqrt{2(m+\frac{1}{2})D\lambda}$. where m is a natural number: 1, 2, 3 .... The above equations are approximated using $D \gg \lambda$ (when the gap D is about 400 $\mu$m, $\lambda$ is about 0.4 $\mu$m.).

The fringes are produced at the positions expressed by the above equations. When a two-dimensional pattern of the mask 2, as shown in FIG. 3(a) for example, is printed on the work 1, the printed pattern on the work 1 has distortion at the peripheral portion, specifically corner portions thereof as shown in FIG. 3(b). Since the light beam 3 for exposure is not a beam of perfect coherent light but includes about 1-5% of coherent light in the bright line, it adversely affects the reproducibility and the resolution of the printed pattern of the mask 2 on the work 1 in the pattern reproduction or printing process.

On the other hand, an exposure apparatus using electron rays or X-rays as a light source in order to eliminate the coherence in the light beam for exposure and an exposure apparatus utilizing an aplanatic projection optical system have been developed. However, such exposure apparatuses require a high degree electronic circuit for controlling a complicated lens system and a device thereof, and are expensive consequently.

SUMMARY OF THE INVENTION

It is an object of the present invention to remove the above problems by providing an exposure apparatus which utilizes a fly eye lens in an optical system which rotates at a proper number of revolutions during the exposure in synchronism with operation of a shutter for intercepting the light beam for exposure.

According to the present invention, the fly eye lens is rotated to obtain the strong plane light source without coherence and thus an inexpensive exposure apparatus having high resolution and a large exposure area and simple in operation can be provided.

PREFERRED EMBODIMENT OF THE INVENTION

Figure 1:
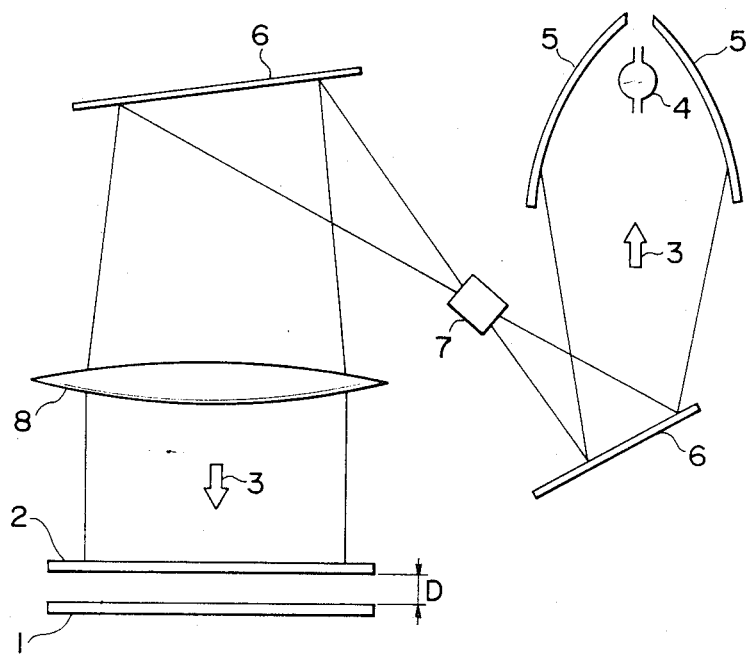
FIG. 1 is a schematic diagram showing a construction of the prior art close type exposure apparatus.
Figure 2:
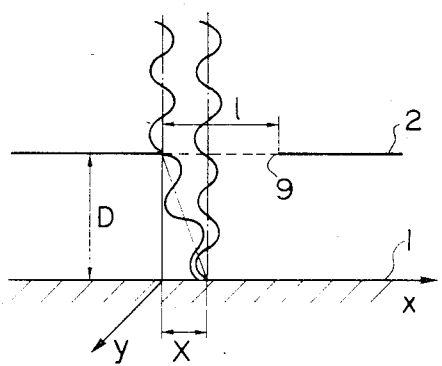
FIG. 2 illustrates a principle of the interference.
Figure 3:
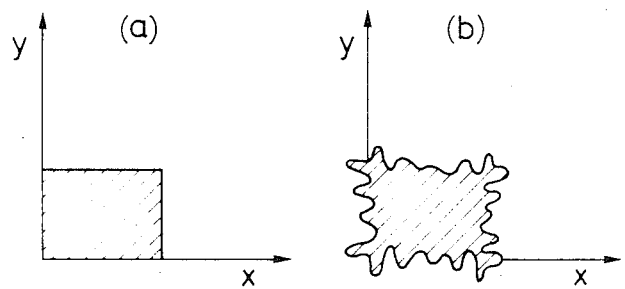
FIGS. 3(a) and (b) illustrate a mask pattern and a printed pattern thereof obtained by the prior art exposure apparatus, respectively.
Figure 4:
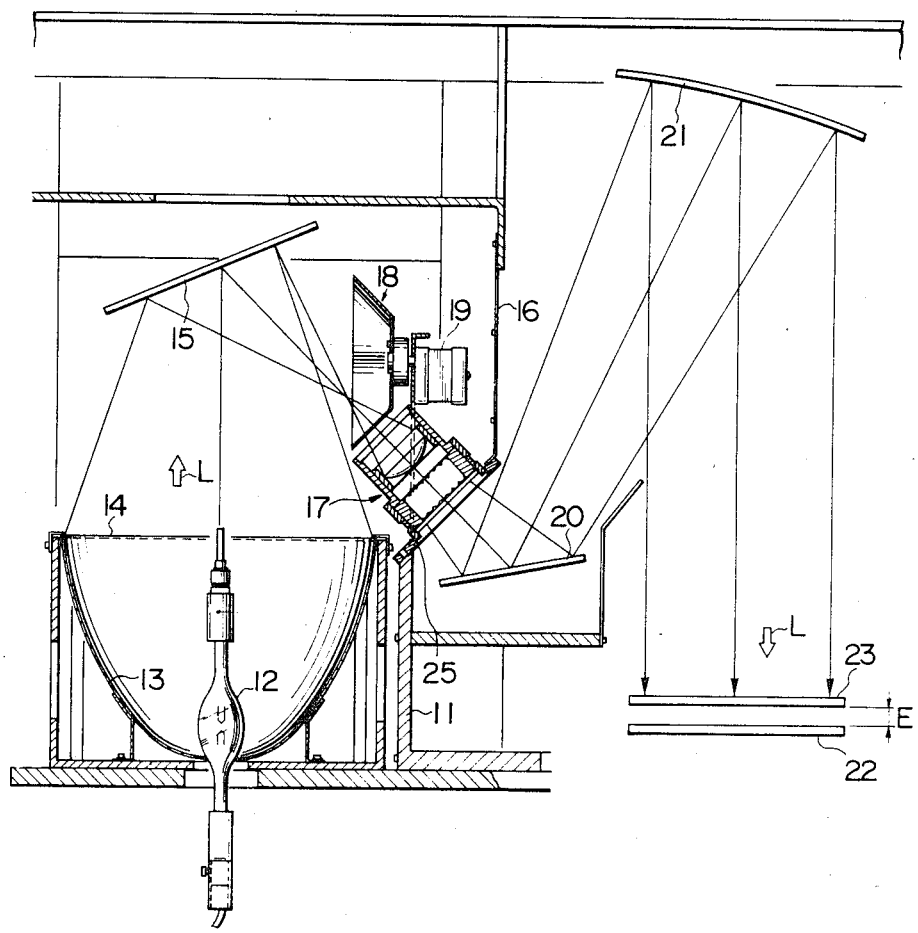
FIG. 4 is a partially cross-sectional plan view showing an exposure apparatus of an embodiment according to the present invention.

Referring to FIG. 4, there is provided a mercury lamp 12 as a light source in a box type housing 11 with proper electric wiring. The mercury lamp 12 may be of a short arc type which has, for example, a distance between electrodes of about 1 mm and an output power of about 1 KW. As a strong ultraviolet light source, a light source using the light produced by discharge in diluted mercury gas is the simplest. An oval concave mirror 13 is fixedly disposed in the housing 11 so that the mirror 13 surrounds the mercury lamp 12. The oval concave mirror 13 is formed with an opening 14 at the upper portion thereof as shown in FIG. 4.

A first reflecting mirror 15 is disposed opposite to the opening 14 and above the housing 11 so that the center of the first mirror 15 is substantially in alignment with the center of the opening 14 and the reflecting surface of the first mirror 15 inclines with regard to the line connecting between the centers i.e. the line of the incident light by a predetermined angle. A first optical system is composed of the oval concave mirror 13 and the first mirror 15. A fly eye lens 17 is rotatably mounted on a side wall 16 of the housing 11 and in the path of the reflected light from the first mirror 15. The center of the fly eye lens 17 is substantially in alignment with the center of the first mirror 15.

A shutter 18 is interposed between the fly eye lens 17 and the first mirror 15 and is mounted on the housing 11. The shutter 18 is adapted to be driven by means of a hysteresis motor 19 with a decelerator (not shown).

At the position opposite to the rear surface of the fly eye lens 17, a second mirror 20 is mounted on the housing 11 so that the center of the second mirror 20 is substantially in alignment with the center of the fly eye lens 17 and the reflecting surface of the second mirror 20 inclines with regard to the line connecting between the centers or the line of the incident light by a predetermined angle. Thus, the shutter 18 and the fly eye lens 17 are interposed between the first mirror 15 and the second mirror 20. A large collimator mirror 21 is disposed in the path of the reflected light from the second mirror 20 and above the housing 11 so that the center of the second mirror 20 is substantially in alignment with the center of the collimator mirror 21 and the reflected light from the collimator mirror 21 is directed downward of the housing 11 substantially vertically. The second mirror 20 and the collimator mirror 21 form a second optical system. The collimator mirror 21 reflects the incident light from the second mirror 20 to collimate it. A collimator mirror having a diameter of 400 mm or more is put into practice, and can be easily manufactured as compared with a transmission type condenser lens and can be available inexpensively.

Numeral 22 denotes a workpiece applied with photoresist on an upper surface thereof. A mask 23 having a predetermined pattern is parallelly spaced above the workpiece 22 by a proximity gap E. The workpiece 22 and the mask 23 are held by means of an ordinary chuck (not shown). The surfaces of the workpiece 22 and the mask 23 are perpendicular to the incident light from the collimator mirror 21.

Figure 5:
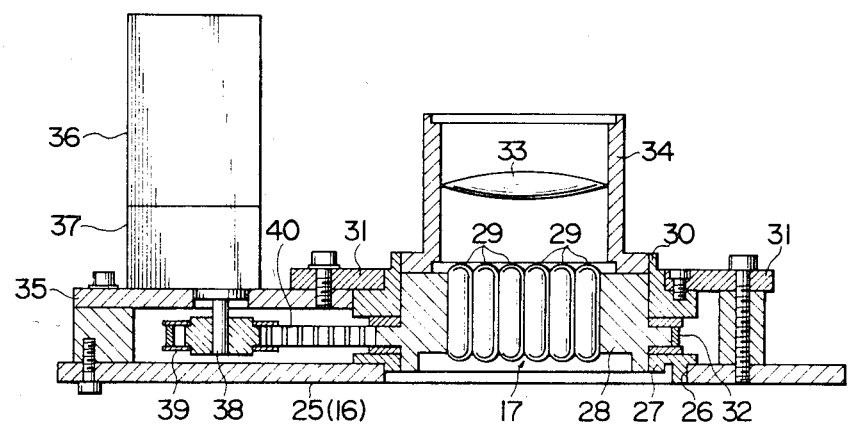
FIG. 5 is an enlarged cross-sectional view of a portion of the exposure apparatus of the present invention.

FIG. 5 shows the enlarged fly eye lens 17 and the peripheral portion thereof. Numeral 25 denotes a substrate fixedly mounted on the side wall 16. A round hole 26 is formed in an end of the substrate 25. A ring sleeve 27 is rotatably inserted into the hole 26.

One end of a holder 28 is rotatably inserted in the inner periphery of the sleeve 27 coaxially. The holder 28 holds the fly eye lens 17 at the inner periphery thereof. The fly eye lens 17 is composed of a number of cigar-shaped lenses 29, for example 25-50 lenses, made up in a bundle.

Numeral 30 denotes an upper sleeve into which the other end of the holder 28 is rotatably inserted so that the other end of the holder 28 is held by the upper sleeve 30. The upper sleeve 30 is fixed on the substrate 25 by means of a holding plate 31.

Regularly arranged ridges for engaging a belt described later are formed on the outer periphery 32 of the holder 28 between the ring sleeve 27 and the upper sleeve 30. A hollow cylindrical portion 34 provided with a convex lens 33 therein is fixedly mounted on the upper end of the holder 28 in the coaxial direction.

Accordingly, the fly eye lens 17 is rotatably supported on the side wall 16 by means of the ring sleeve 27 and the upper sleeve 30.

A supporting plate 35 is attached on the other end of the substrate 25 by means of a bolt or the like. A controllable induction motor 36 is mounted on the supporting plate 35. The induction motor 36 is coupled to a decelerator 37 of which an output axle 38 is projected between the substrate 25 and the supporting plate 35.

A pulley 39 formed with ridges on the outer periphery thereof is fixedly mounted on the output axle 38. A drive belt 40 provided with notches on the inner surface thereof is wound between the pulley 39 and the outer surface 32 of the holder 28.

Thus, when the induction motor 36 rotates, the fly eye lens 17 and the convex lens 33 rotate with regard to the substrate 25 through the sleeves 27 and 30.

A motor 19 for driving the shutter 18 and the induction motor 36 are rotated in a predetermined relation by means of a control circuit not shown.

Operation of the exposure apparatus according to the present invention will be described.

The light for exposure emitted from the mercury lamp 12 is reflected by the oval concave mirror 13 to be condensed as a light beam L and is directed toward the first mirror 15. The incident light beam L upon the first mirror 15 is reflected by the mirror 15 to be directed to the convex lens 33 through the shutter 18. The light beam L is slightly converged by the convex lens 33 so that the light beam enters into an end surface of the lenses 29 forming the fly eye lens 17.

The light beam L passing through the fly eye lens 17 is reflected by the second mirror 20 by a predetermined reflection angle to be directed to the collimator mirror 21.

Figure 6:
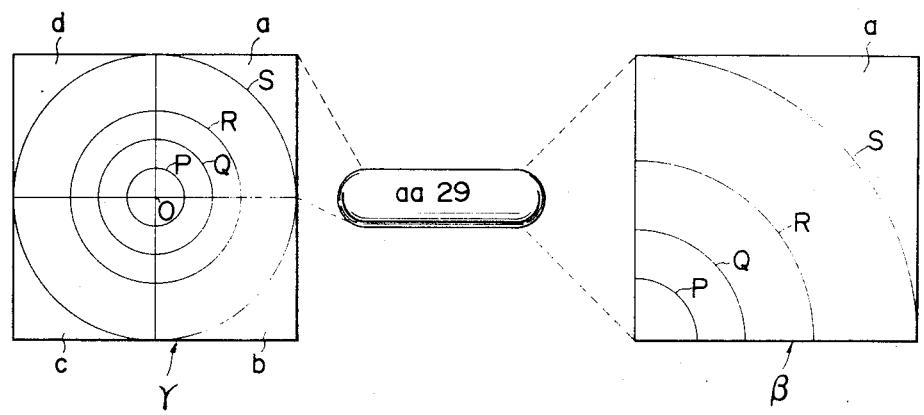
FIG. 6 shows a distribution of illuminance.
Figure 7:
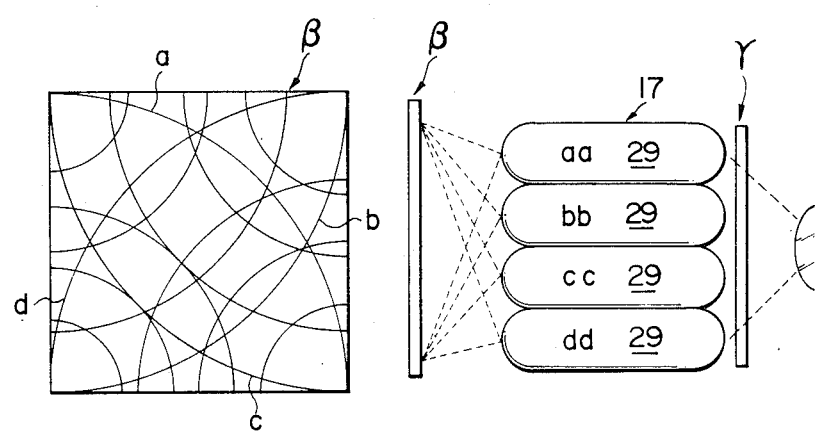
FIG. 7 illustrates uniformity of a distribution of illuminance.

Referring to FIGS. 6 and 7, the illuminance on an imaginary plane λ just before the fly eye lens 17 is distributed into the concentric circles as shown in FIG. 6. This is because the arc image is enlarged by the oval concave mirror 13 and is projected on the plane. Assuming that the illuminance in a circle P with a center O thereof is 100, the illuminance in a circle Q is 80, in a circle R 60, and in a circle S 50. The incident light beam L upon the individual lenses 29 of the fly eye lens 17 is influenced by the lenses 29 as follows. Considering the lenses 29 (aa), a quarter of the concentric circles P, Q, R and S, i.e. an area a is projected by the lenses 29 (aa) on an imaginary plane β behind the lenses 29 (aa) over the whole plane β (FIG. 6). In the same manner, an area b is projected by the lenses 29 (bb) over the whole plane β, an area c is projected by the lenses 29 (cc), and an area d is projected by the lenses 29 (dd) as shown in FIG. 7. Thus, the ununiformity of the illuminance distribution is enlarged over the whole area and each illuminance distribution is overlapped, and hence the illuminance over the plane β becomes uniform overall by increasing the number of the lenses 29.

Accordingly, the incident light beam upon the second mirror 20 has a uniform distribution of illuminance and is reflected toward the collimator mirror 21. The light beam is collimated by means of the collimator mirror 21 to be directed to the mask 23. At this time, the induction motor 36 is driven by a control circuit (not shown) and the decelerated output axle 38 thereof rotates the fly eye lens 17 through the pulley 39 and the drive belt 40.

The exposure time through the shutter 18 is controlled by the number of revolutions of the hysteresis motor 19. The number of revolutions of the fly eye lens 17 is set up to any number of revolutions with regard to the exposure time by the control circuit. If the exposure time is, for example, 1 second, the number of revolutions can be set up to 4 revolutions per second.

The light beam L for exposure emitted from the mercury lamp 12 contains the bright line spectrum, i.e. the coherent component by several percent. However, when the light beam passes through the lenses 29 of the fly eye lens 17, the phase of the light beam is disturbed partially. Furthermore, when the fly eye lens 17 is rotated, the remaining coherent bright line spectrum is almost converted to non-coherent light.

The non-coherent light beam L is directed to the mask 23 and the pattern of the mask 23 is printed on the work 22 without the interference fringes.

Figure 8:
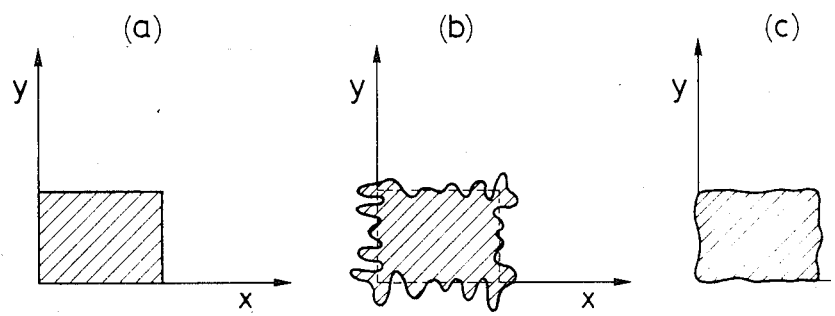
FIGS. 8(a), (b) and (c) illustrate a mask pattern and printed patterns thereof reproduced by the exposure apparatus of the present invention.

According to an experiment performed by the inventor, when a rectangular pattern as shown in FIG. 8(a) was printed on the work 22 with the pattern width of the mask 23 being 5-30 $\mu$m and the proximity gap being 10-400 $\mu$m, a printed pattern as shown in FIG. 8(b) was obtained if the fly eye lens 17 was not rotated, while a printed pattern having a clear peripheral boundary as shown in FIG. 8(c) was obtained if the fly eye lens 17 was rotated at a predetermined speed.

The exposure apparatus of the present invention is suitable for manufacturing the printed pattern on the work, specifically for use in a liquid crystal, a thermal printer, or a hybrid IC, which has a large work size and requires the proximity gap to be set up for printing the pattern and a pattern accuracy having a grid of about 10 $\mu$m.

What is claimed is:

1. An exposure apparatus for exposing a workpiece to light, which light passes through a mask so that exposed portions of the workpiece correspond to a pattern of the mask, said apparatus comprising: light source means for emitting light to expose the workpiece, first optical system means for condensing the light emitted from said light source means to form a light beam and to project the light beam along a first path, a fly eye lens operatively disposed along said first path wherein the light beam condensed by said first optical system means passes through said fly eye lens, second optical system means for collimating the light beam passing through said fly eye lens to direct the collimated light beam along a second path to the workpiece through the mask to expose portions of the workpiece to the collimated light beam which correspond to the pattern of the mask, mounting means for mounting said fly eye lens for rotation about an axis established by said first path, and lens drive means for rotating said fly eye lens at a predetermined number of revolutions about said axis.

2. An exposure apparatus according to claim 1, further comprising shutter means disposed in front of said fly eye lens for intercepting the light beam along said first path.

3. An exposure apparatus according to claim 2, further comprising shutter drive means for operating said shutter means to control exposure time of said workpiece to the collimated light beam.

4. An exposure apparatus according to claim 1, wherein said first optical system means includes concave mirror means for reflecting the light emitted from said light source means and for condensing the emitted light, and first mirror means for reflecting the emitted and condensed light reflected by said concave mirror means to form the light beam and for directing the light beam to said fly eye lens.

5. An exposure apparatus according to claim 1, wherein said second optical system means includes second mirror means for reflecting the light beam passing through said fly eye lens and collimator mirror means for receiving the light beam reflected by said second mirror means to collimate the light beam and to pass the collimated light beam on to the workpiece.

6. An exposure apparatus according to claim 1, wherein said light source means includes a far ultraviolet arc lamp having mercury vapor therein.

7. An exposure apparatus as in claim 1 wherein said lens drive means includes a motor and means for coupling said motor to said fly eye lens.

8. An exposure apparatus as in claim 7 wherein said means for coupling includes a drive pulley fixed to said motor and a drive belt operatively coupling said drive pulley and said mounting means.

9. An exposure apparatus as in claim 7 wherein said mounting means includes holder means for holding said fly eye lens, and sleeve means for supporting said holder means and thus said fly eye lens for said rotation about said axis.

* * * * *